United States Patent
Melanson

(10) Patent No.: US 6,727,832 B1
(45) Date of Patent: Apr. 27, 2004

(54) DATA CONVERTERS WITH DIGITALLY FILTERED PULSE WIDTH MODULATION OUTPUT STAGES AND METHODS AND SYSTEMS USING THE SAME

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/306,598

(22) Filed: Nov. 27, 2002

(51) Int. Cl.$^7$ .................................................. H03M 3/00
(52) U.S. Cl. ...................................................... 341/143
(58) Field of Search ................................. 341/143, 138, 341/144, 155

(56) References Cited

U.S. PATENT DOCUMENTS 6,414,613 B1 * 7/2002 Midya et al. ................ 341/143

* cited by examiner

*Primary Examiner*—Brian Young
(74) *Attorney, Agent, or Firm*—James J. Murphy; Winstead Sechrest & Minick P.C.

(57) ABSTRACT

A digital to analog converter including a noise shaping modulator for modulating an input digital data stream, a plurality of output elements for generating a plurality of intermediate data streams from a modulated output stream from the modulator, and an output summer for summing the intermediate data streams to generate an output analog stream. The noise shaping modulator balances an edge transition rate of the output elements, such that the edge transition rate of two selected elements is approximately equal.

34 Claims, 6 Drawing Sheets

DATA CONVERTERS WITH DIGITALLY FILTERED PULSE WIDTH MODULATION OUTPUT STAGES AND METHODS AND SYSTEMS USING THE SAME

FIELD OF INVENTION

The present invention relates in general to delta-sigma data converters, and, in particular, to data converters with digitally filtered pulse width modulation output stages and methods and systems using the same.

BACKGROUND OF INVENTION

Delta-sigma modulators are particularly useful in digital to analog and analog to digital converters (DACs and ADCs). Using oversampling, the delta-sigma modulator spreads the quantization noise power across the oversampling frequency band, which is typically much greater than the input signal bandwidth. Additionally, the delta-sigma modulator performs noise shaping by acting as a lowpass filter to the input signal and a highpass filter to the noise; most of the quantization noise power is thereby shifted out of the signal band.

The typical delta sigma modulator includes a summer summing the input signal with negative feedback, a loop filter, a quantizer, and a feedback loop coupling the quantizer output and the inverting input of the summer. In a first order modulator, the loop filter includes a single integrator or other filter stage while the loop filter in a higher order modulator has a cascade of a corresponding number of filter stages. Higher-order modulators have improved quantization noise transfer characteristics over those of lower order, but stability becomes a more critical design factor as the order increases. The quantizer can be either a one-bit or a multiple-bit quantizer.

In DAC applications, such as low out-of-band noise DACs, continuous-time output stages, such as current summers, which convert the quantized modulator output into a relatively smooth analog signal have a number of advantages over discrete-time output stages, such as switched capacitor output stages. For example, in DAC systems in which the modulator output is quantized into a large number of levels (e.g. sixty-four or more levels represented by eight or more bits), continuous-time output stages are relatively easy to design and construct. In addition, continuous-time output stages operating on a large number of quantization levels are relatively immune to jitter and the problem of sampling of far out-of-band energy. These advantages make continuous-time output stages the best choice for integration into large digital chips. With respect to smaller data converters and coder-decoders (Codecs), avoiding the sampling of high frequency energy allows for the simplification of the clock management scheme.

Despite their advantages, continuous-time output stages are also subject to significant drawbacks, such as a susceptibility to inter-symbol interference. (Inter-symbol interference or ISI in this case is usually caused by asymmetry in leading and trailing edges of the output signals from continuous time elements or from analog memory, in which each symbol is dependent on the prior one.) ISI can dominate the noise and distortion components in the output analog stream of a continuous-time data converter, even if a large number of continuous-time conversion elements operate on data samples with a large number of quantization levels. While ISI can be minimized using return to zero (RTZ) techniques, RTZ techniques generally cause increased circuit sensitivity to the characteristics of the controlling clocks.

Therefore, improved circuits and methods are required which allow continuous-time output stages to be utilized in such applications as DACs while minimizing ISI and at the same time reducing the effects of clock characteristics on circuit performance.

SUMMARY OF INVENTION

According to one particular embodiment, a digital to analog converter is disclosed including a noise shaping modulator for modulating an input digital data stream, a plurality of output elements for generating a plurality of intermediate data streams from a modulated output stream from the modulator, and an output summer for summing the intermediate data streams to generate an output analog stream. The noise shaping modulator balances an edge transition rate of the output elements, such that the edge transition rate of two selected elements is approximately equal. By balancing the edge transition rate of the elements, the effects of ISI are largely eliminated.

Application of the present inventive principles provides for the design and construction of digital data converters, in particular DACs, utilizing continuous-time output elements with minimal susceptibility to ISI and clock vagaries. Generally, a duty-cycle modulator receives a digital input stream and generates a duty-cycle, pulse width modulated (PWM) encoded data stream. A finite impulse response (FIR) filter removes the fundamental frequency and harmonics of the PWM rate from the duty cycle modulated stream. By tapping the stages of the FIR filter with a plurality of digital to analog conversion elements, in either a continuous-time or discrete-time manner, an analog output signal is generated with reduced distortion due to jitter of ISI. In one particular embodiment, multiple pulse width modulator stages are interleaved in time to generate multiple time-overlapping PWM-encoded data streams. These overlapping PWM-encoded data streams drive multiple conversion elements with matched utilization and transition rates. A delta-sigma modulator with multiple attenuation bands in front of the interleaved PWM stages attenuates noise that would otherwise be demodulated by mismatch between the analog stages. A FIR filter coupled after each interleaved PWM stage removes out of band energy caused by the PWM process.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1A:
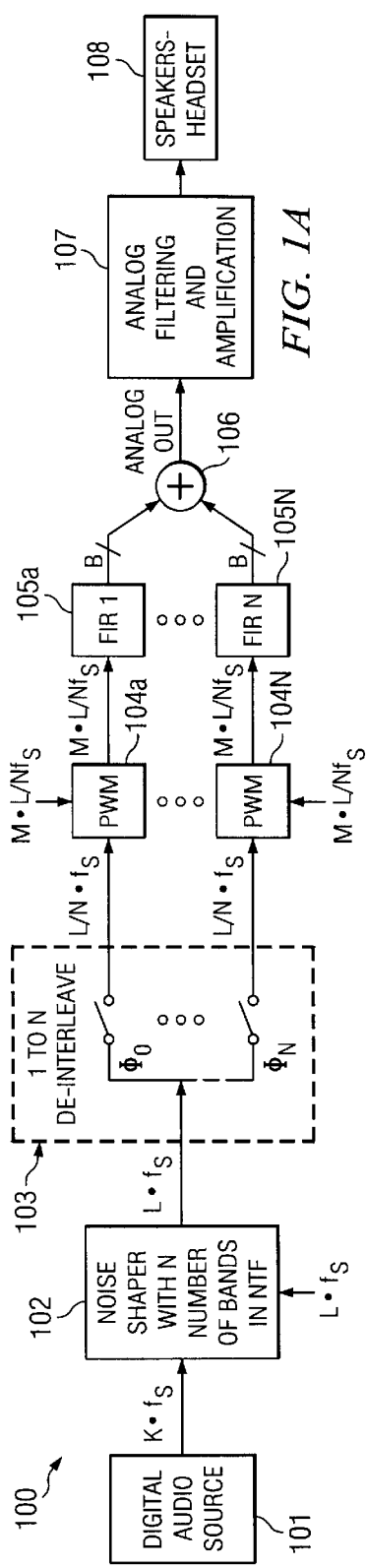
FIG. 1A is high level block diagram of an exemplary digital audio system including a digital to analog converter utilizing a delta-sigma modulator with multiple attenuation bands and interleaved pulse width modulators according to the inventive principles.

FIG. 1A is a high-level functional block diagram of an exemplary digital to analog converter system 100 suitable for demonstrating the principles of the present invention. For purposes of discussion, an audio application is described operating on digital audio from a source 101 such as a compact disk (CD) or digital versatile disk (DVD) player; however, the concepts described below can be utilized in a wide range of circuits and systems requiring digital to analog conversion. In system 100, the data output from digital source 101 is multiple-bit audio data having a base sampling frequency (rate) fs and oversampled by an oversampling factor K. For example, in the illustrated embodiment the audio stream is output from digital audio source 101 with a base sampling frequency (fs) of 48 kHz with sixty-four times (64×) oversampling (i.e., K=64).

System 100 is based on a multiple-bit noise shaper 102 (e.g. delta sigma modulator) with multiple attenuation bands in the noise transfer function (NTF). Noise shaper 102 will be discussed in detail further below; however, generally the NTF includes one attenuation band for attenuating noise in the signal passband and additional attenuation bands for attenuating noise, which would otherwise be demodulated by any non-zero mismatch between the following pulse width modulation (PWM) stages 104 in the multiple PWM stage embodiments discussed below.

Noise shaper 102 in the illustrated embodiment outputs multi-bit quantized samples at an oversampling frequency L·fs, in which L is the oversampling ratio of noise shaper 102. The modulation index (MI) of noise shaper 102 is preferably set to ensure that full scale output quantization levels are not output to the following PWM stages 104. However, in alternate embodiments, in which some level of the ISI in the output stream is tolerable, full-scale quantization levels are utilized.

Each one-bit sample output from noise shaper 102 is interleaved by 1 to N interleave circuitry 103 into a corresponding one of a set of N parallel PWM stages, in which N is an integer greater than or equal to 1. In FIG. 1A, representative pulse width modulation (PWM) stages 104a to 104N, are shown for discussion purposes. Each PWM stage 104a to 104N therefore effectively operates on input samples at a rate of L/N·fs. Exemplary PWM stages suitable for use as PWM stages 104a to 104N of system 100 are described in coassigned U.S. Pat. No. 6,150,969 to Melanson, entitled Correction of Nonlinear Output Distortion In a Delta Sigma DAC, and U.S. Pat. No. 5,815,102 to Melanson, entitled Delta Sigma PWM DAC to Reduce Switching, both of which are incorporated herein by reference. Interleave circuitry 103 is an exemplary circuit. A typical implementation for PWM stages 104a, 104b may be to connect them to noise shaper 102 and allow them to only be responsive to the appropriate samples from noise shaper 102. If N was 2, for example, PWM stage 104a would be responsive only to the even samples from noise shaper 102, and PWM stage 104b would only be responsive to only the odd samples.

In the illustrated embodiment of system 100, each of PWM stages 104a to 104 N operates with an oversampling factor M and an oversampling clock signal at an oversampling frequency M·(L/N)fs. Each PWM stage therefore outputs M number of N/(M·L) clock period long PWM patterns representing (M+1 levels) per sample received from interleave circuitry 103. In addition to the energy in the signal base band (approximately 0 to fs/2), each PWM stage 104a to 104 N also outputs significant energy at the fundamental frequency and harmonics of the PWM repeat rate of L/N·fs. Hence, each PWM stage 104a to 104N is followed by a digital-in, analog-out finite impulse response (FIR) filter with attenuation bands corresponding to these harmonics. Representative FIR filters 105a to 105N are shown in FIG. 1A. The analog outputs from FIR filters are summed into output summer 106 to generate the analog output.

By this series of operations, system 100 ensures that the usage of all output elements 111a, . . . ,N of FIR filters 105a to 105N (discussed below) is approximately the same, as guaranteed by multiple NTF zeros of delta-sigma noise shapers 102, (also discussed further below). In alternate embodiments, other techniques, such as independent delta-sigma modulators, may be used. In addition, by this construction of system 100, the edge rate of all of the elements 111a–111b is also approximately equal. This result is due to a side effect of the fixed edge rate of combined delta-sigma modulators and pulse width modulators in general. Taken together, these two constraints remove much of the source for distortion in analog output stages. Other techniques for directly balancing the edge rates are possible in alternate embodiments. As an example, the edge rate could be monitored, and the transitions probability modified in response.

Figure 1B:
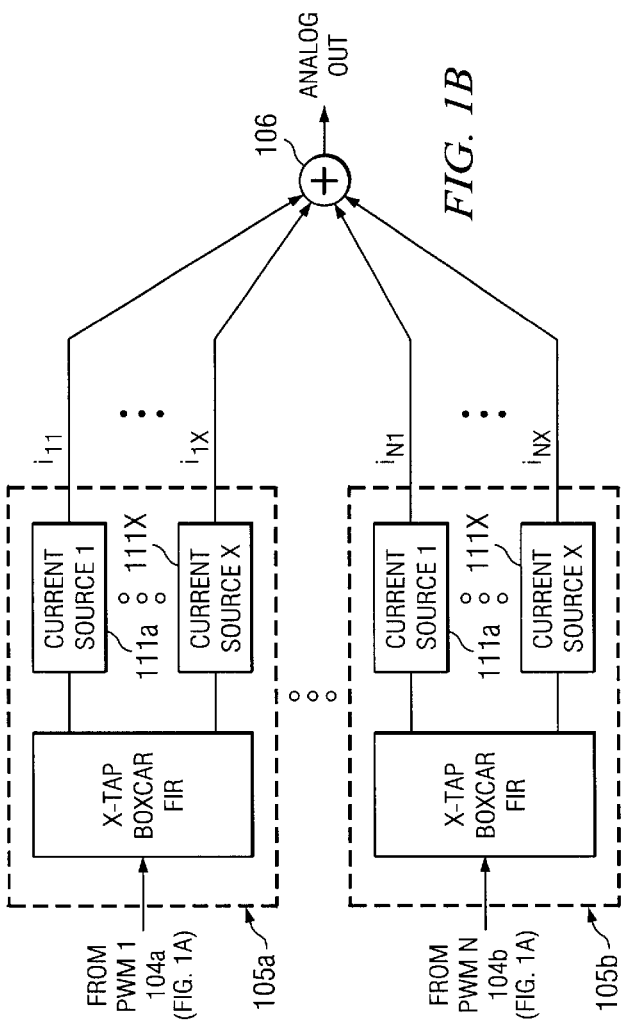
FIG. 1B is a more detailed block diagram of an exemplary digital-in, analog-out finite impulse response (FIR) filter suitable for use in the exemplary analog-in, digital-out FIR blocks shown in FIG. 1A.

FIG. 1B illustrates exemplary embodiments of digital-in, analog-out FIR filters 105a to 105N in further detail. Each filter 105a to 105N includes a conventional FIR filter, such as a boxcar filter with simple coefficients, with X number of output taps. The length (number of stages) of each FIR filter 105a to 105N is greater than or equal to the width of the PWM pattern from the preceding PWM stage 104a to 104N, which introduces a notch in the filter output transfer function corresponding to the fundamental of the PWM repeat frequency. In other words, the length of each FIR filter 105a to 105N is proportional to the ratio of the output frequency of the FIR filter to the input frequency of the FIR filter. Longer FIR filters 105a to 105N (e.g. FIR filters with more stages) will attenuate more out of band energy at the cost of increased number of elements. Using FIR filters 105a to 105N with equal weights, the number of taps equal to the PWM pattern length, is an easy technique to significantly reduce out of band energy.

Each of the x number of filter taps, (in which x is an integer greater than one) is associated with a current source or similar single-bit digital to analog conversion elements, two of which are shown at 111a and for each filter 105a to 105N. Current sources 111a, . . . ,N are of a simple constructions, such as a voltage source and a resistor or transistors operating in a constant current region or cascoded transistors. The outputs from current sources are either single-ended or differential sources. In the illustrated embodiment, output summer 106 includes a current to voltage converter when single-bit digital to analog conversion is performed by current sources 111a, . . . ,N. The currents can be equal, as in a boxcar filter, or unevenly weighted. Advantageously, boxcar embodiments of FIR filter 105a to 105N, with equal taps are the simplest to implement and are adequte for most purposes.

In audio system 100, the analog output signal generated by summer 106 is subject to additional conventional analog filtering and amplification in analog filtering and amplification circuit block 107. A headset or set of speakers 108 provides the audible output.

Figure 2A:
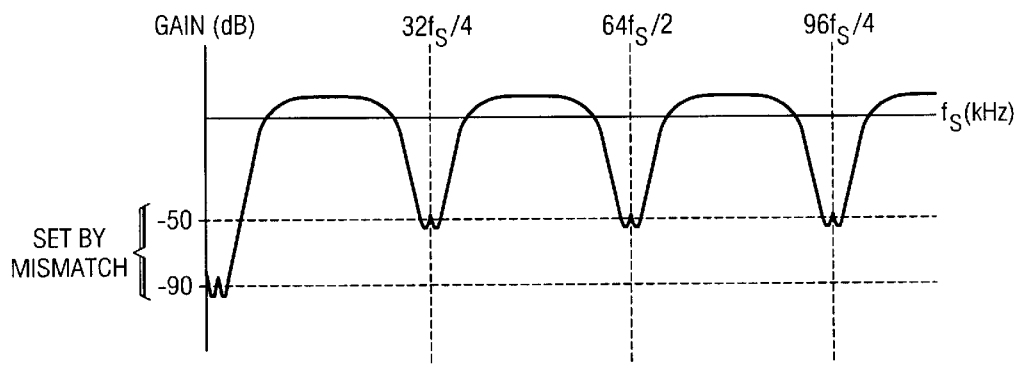
FIG. 2A is a gain versus frequency plot of the noise transfer function (NTF) of an exemplary delta-sigma modulator with four noise attenuation bands suitable for use in selected embodiments of the data converter of FIG. 1 utilizing four interleaved pulse width modulators.
Figure 2B:
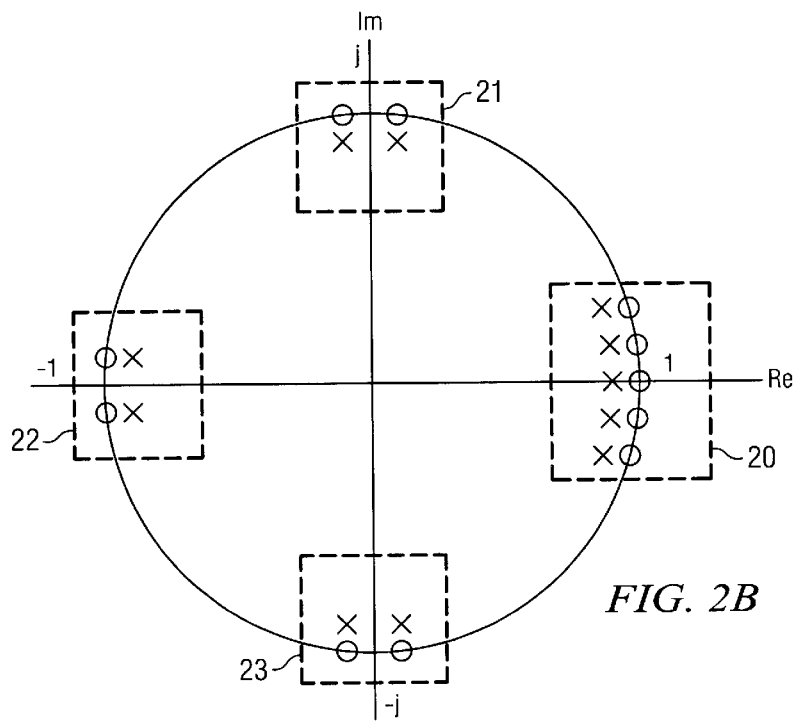
FIG. 2B is a plot in the z-plane of the poles and zeros of a delta-sigma modulator with multiple NTF noise attenuation bands corresponding to the noise attenuation bands shown in FIG. 2A.

The operation of noise shaper 102 for a by-four (i.e. N=4) interleaved system 100 is illustrated in FIGS. 2A and 2B. If N=4, noise shaper 102 outputs quantized samples that are split into four (4) sample streams each at a frequency of L·fs/4. In this example, noise shaper 102 outputs data samples at an oversampling frequency 128 fs, and interleave circuitry 103 therefore splits the noise shaped data stream into four streams, each at a frequency of 32fs. Any mismatch between the following PWM stages 104a to 104N therefore demodulates the noise in the modulator bands 128·fs/4, 128·fs/2 and 128·3fs/4 (respectively 32fs, 64fs and 96fs). Advantageously, the use of a PWM stage 105a to 105N in each output increases the effective matching accuracy of the following DAC elements, since the effect of the output mismatch is reduced by the number of slots in the PWM up-sampling.

As shown in FIG. 2A, the noise exposed to any non-zero mismatch between PWM stages 104a, . . . ,N, is minimized by three additional attenuation bands included in the noise transfer function (NTF) of noise shaper 102 about the frequencies 32fs, 64fs and 96fs along with the noise attenuation band at the signal baseband. The difference between the average level of attenuation in the signal band and the average level attenuation at the frequencies 32fs, 64fs, and 96fs depends on the mismatch between the following PWM stages 104a to 104N. If more mismatch exists, then more modulator noise is demodulated in the frequencies bands about 32fs, 64fs and 96fs, and the more attenuation in the modulator NTF around the frequencies 32fs, 64fs and 96fs is required. However, an increase in attenuation at the frequencies 32fs, 64fs and 96fs results in a decrease in attenuation in the signal band. (Generally, the area below the x-axis of FIG. 2A must equal the area above the x-axis.) Thus, a balancing must be made between the global noise shaping of the NTF across the modulator output frequency spectrum and local attenuation levels around 32 fs, 64 fs, and 96fs.

An NTF in noise shaper 102 with a given difference between the average attenuation level in the signal band and the average attenuation about the frequencies 32fs, 64fs and 96fs needs to be produced. A noise shaper topology which produces a one set of pole—zero pairs for setting the NTF signal band attenuation and sets of fewer poles about the frequencies 32fs, 64fs and 96fs is required. A z-plane plot of the pole and zeros characterizing one such noise shaper is shown in FIG. 2B. In this example, an $11^{th}$ order noise shaper is characterized, which includes a first set 20 of five (5) pole-zero pairs that define the shape of the low frequency (signal band) noise attenuation of the NTF. In the illustrated embodiment, pole-zero pair set 20 includes four (4) pole-zero pairs at Butterworth locations and one (1) real pole-zero pair. Three additional sets 21, 22, and 23 of poles respectively define the shape of the noise attenuation bands about the frequencies 32fs, 64fs, and 96fs. The number of poles and zeros in each set 20–23 may vary between embodiments, depending on the desired noise shaping desired and the tradeoff between the attenuation level in the NTF signal band and the attenuation levels in the 32fs, 64fs, and 96fs frequency bands of the NTF. In FIG. 2B, the NTF zeros at 32fs, 64fs and 96fs are split along the unit circle in the z-plane. In alternate embodiments, these zeros may remain un-split (co-located) to reduce the amount of hardware required to implement noise shaper 102.

Exemplary delta sigma modulator (noise shaper) topologies, which generate multiple attenuation bands in the NTF and which are suitable for use in noise shaper 102 are described in copending and coassigned patent application entitled "DELTA-SIGMA MODULATION CIRCUITS AND METHODS UTILIZING MULTIPLE NOISE ATTENUATION BANDS AND DATA CONVERTERS USING THE SAME" (U.S. Ser. No. 0/191,016,) incorporated herein by reference. For example, the z-plane pole-zero plot shown in FIG. 2B may be achieved by using the interleaved modulator topology 200 shown in FIGS. 2C and 2D, and discussed briefly below. Alternatively, a feedforward design may be utilized having five filter stages with a transfer function of $1/(1-Z^{-1})$, and associated feedback loops, which place poles and zeros about the Z=0 point and a pair of filter stages with a transfer function of $1/(1-Z^{-4})$, and associated feedback loops, which place poles and zeros about the z-plane points Z=1,-1, j and -j. A feedback modulator may be used in other embodiments, although a feedback topology requires more precise coefficients and additional hardware. A general discussion of delta-sigma modulator topologies, including feedforward designs, is be found in publications such as Norsworthy et al., *Delta-Sigma Data Converters, Theory, Design and Simulation*, IEEE Press, 1996).

In exemplary modulator topology 200, shown in FIGS. 2C, the local noise shaping at the frequencies fs/4 (z-plane point Re=0, Im=j), fs/24 (z-plane point Re=−1, Im=0) and 3fs/4 (z-plane point Re=0, Im=j) are implemented using four respective sets of independent loop filter stages 201a–201d, the outputs of which are interleaved in time by switch ("SW") 202 into the main noise shaping loop 209 discussed below. Each set of independent filter stages 201a–201d, shown in further detail in FIG. 2D, includes a pair of filter stages 203a and 203b, corresponding feedforward stages 204a and 204b with coefficients $C_1$ and $C_2$ for setting the local poles, and a feedback loop 205 (with one delay $Z^{-1}$ and gain g1) and summer 206 for setting the local zeros. (The structure of each independent filter stage 201a–201d may vary from a single filter stage 203 to three or more filter stages 203 and include more than one feedback loop, depending on the desired number and location of the local poles and zeros). The outputs from gain stages 204a–204b of independent loop filter stage 201a–201d are interleaved by a corresponding set of switches (SW) 207a–207b into the modulator output summer 208.

The global (baseband) noise shaping about DC ((direct current or zero frequency) (z-plane point Re=0, Im=0) is characterized by a fifth ($_5$th) order, main (shared) noise shaping loop 209. Main noise shaping loop 209 is shown in further detail in FIG. 2E and includes five (5) global filter stages 210a–210e and associated feedforward stages 211a–211e with respective coefficients $C_3$–$C_7$ feeding-forward into output summer 208 (see FIG. 2C). (The number of global filter stages 210a–210e may also vary from embodiment to embodiment depending on the desired number and locations of the global pole—zero pairs in the NTF.) Feedback loops 212a–212b (including a gain of g2 and a delay $Z^{-1}$) and summers 213a–213b are shown for moving the global noise shaping zeros on the z-plane unit circuit away from the DC point (Re=1, Im=0).

While the energy of each PWM stage 105a to 105N generally tracks the input energy over time (e.g., the first integral of the output energy tracks the first integral of the input energy), apparent distortion in the PWM output occurs because the moments of the PWM output energy vary with different PWM patterns (e.g., the values of the second and higher order integrals of the PWM output energy do not track the values of the higher order integrals of the input energy). In particular, the location of the second or higher moment for a given PWM output pattern depends on the specific digital word being converted and the corresponding number of logic high and logic low slots in the pattern, as well as the distribution of those slots across the time period of the pattern. The distribution of the slots in each pattern is affected, for example, by the technique used to generate that pattern (e.g., grow right, grow left, etc.).

Figure 2C:
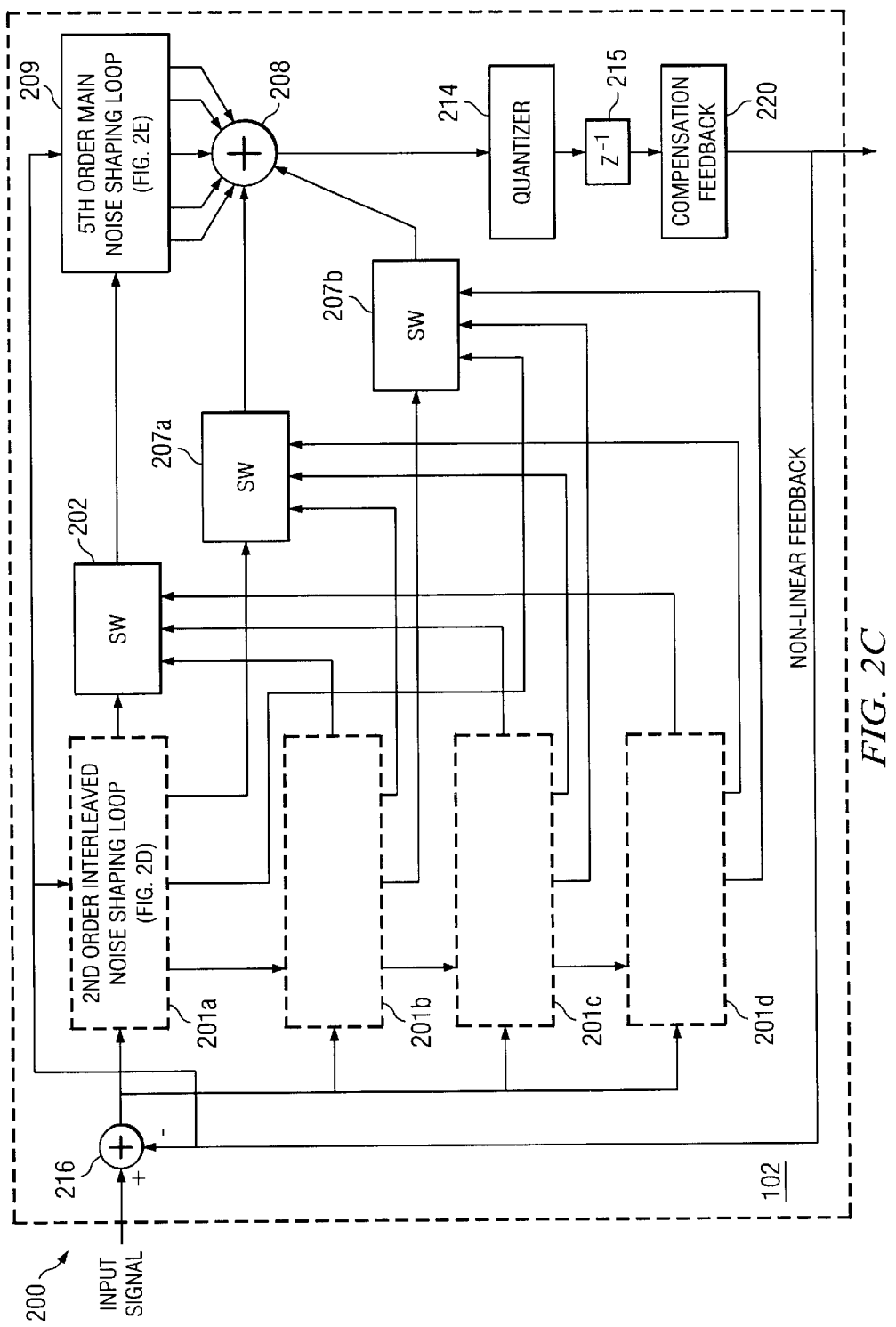
FIGS. 2C–2E are block diagrams of exemplary feedforward delta-sigma modulators suitable for producing the pole-zero placements shown in FIG. 2B.
Figure 2D:
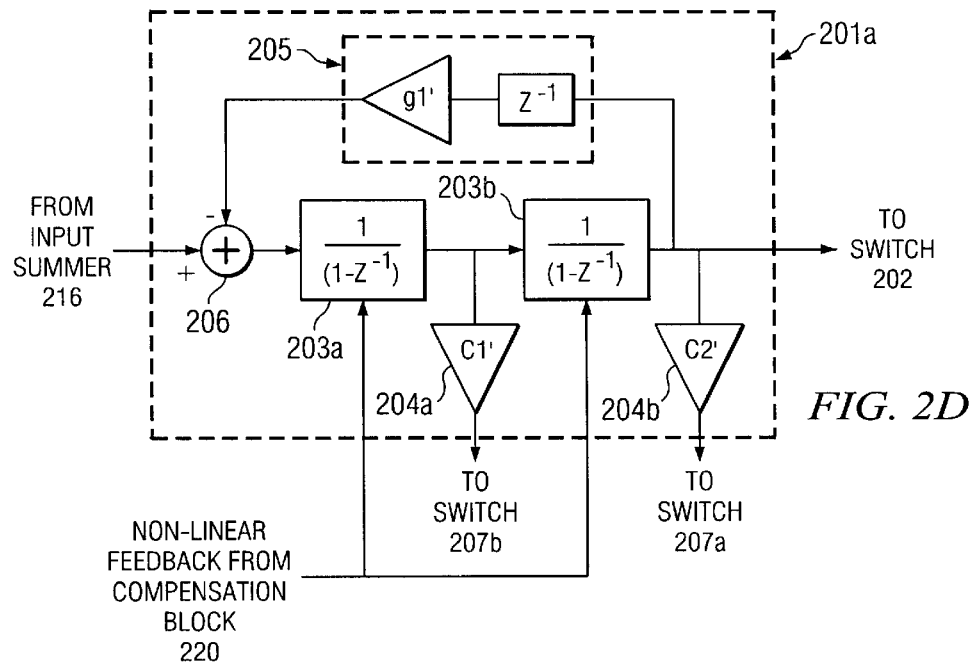
Figure 2E:
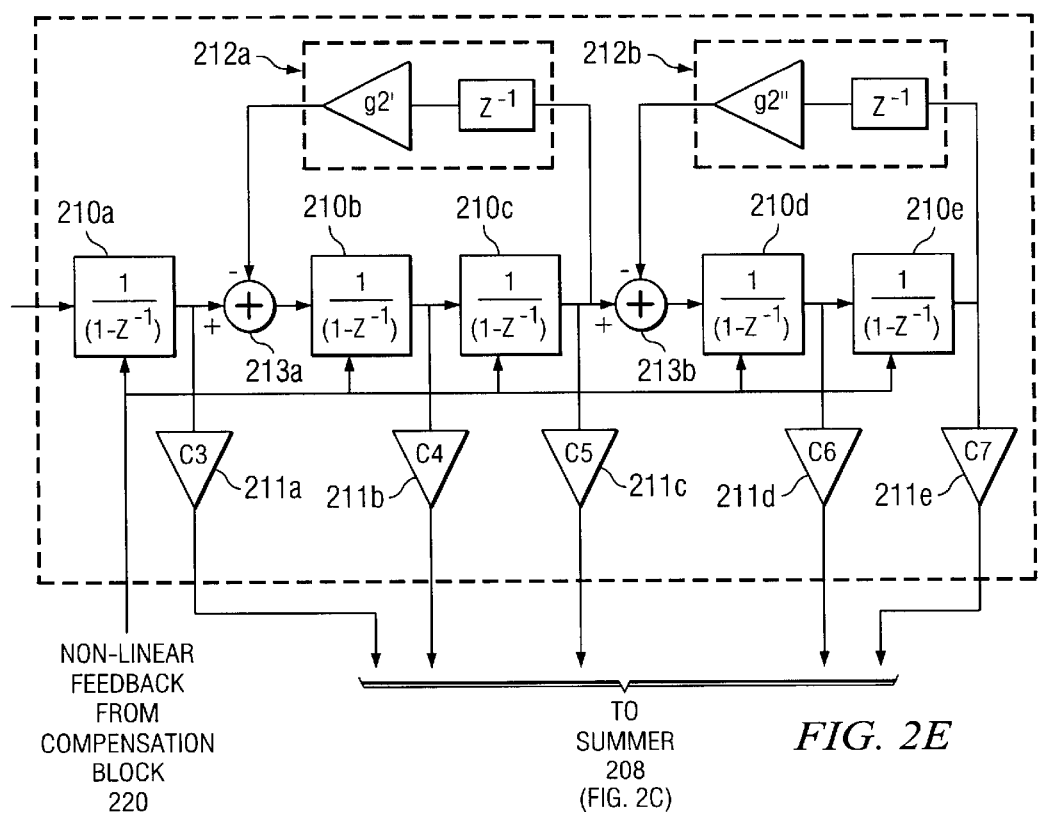

In delta-sigma modulator 102 of FIG. 2C, a feed back compensation block 220 is included at the output of quantizer 214 to provide nonlinear feedback to the integrator stages 203a–203b of second order loop filters 201 (see FIG. 2D) and/or integrator stages 210a–210e of fifth order loop filter 209 (see FIG. 2E). The nonlinear feedback provided by feedback compensation block 220 is described in incorporated U.S. Pat. Nos. 6,150,969 and 5,815,102, which were earlier cited and incorporated by reference. Generally, correction factors are fed back from feedback compensation block 220 to integrator stages 203a–203b and 210a–210b of delta-sigma modulator loop filters 201a to 201d and 209. By selectively correcting the inputs to the corresponding integrator stages, the moments of the data into the inputs of the following PWM stages 105a to 105N are varied. In turn, the moments of the PWM outputs are corrected to reduce distortion, which would otherwise result from time varying output energy moments. For example, to correct for variations in the second moment in a given PWM output pattern, nonlinear correction factors are fed back to at least the second integration stages of the delta-sigma modulator loop filters 201a to 201d and 209.

Returning to FIG. 2C, a single-bit quantizer 214 and a delay element ($Z^{-1}$) 215 preferably generate the output of modulator 200. The resulting output signal is fed-back to the inverting input of the modulator-input summer 216 to close the delta-sigma loop. By interleaving between independent sets of filter stages 201a–201d, each set of filter stages 201a–201d is contributing to the input of summer 208 at one-quarter (¼) of the sampling rate fs at the modulator input. Consequently, the poles and zeros set by filter sets 201a–201d are translated to the z-plane points shown in FIG. 2B.

Continuing with the by-four interleaved (N=4) embodiment of data converter 100 of FIG. 1, the four 32fs quantized sample streams output from interleaving circuitry 103 are respectively passed to four PWM stages 104a to 104N. In this example, each PWM stage 104a to 104N performs an eight-times (8×) oversampling from a 256fs oversampling clock signal (i.e. M=8). The resulting PWM encoded output pulse streams overlap in time, as shown in FIG. 3.

Figure 3:
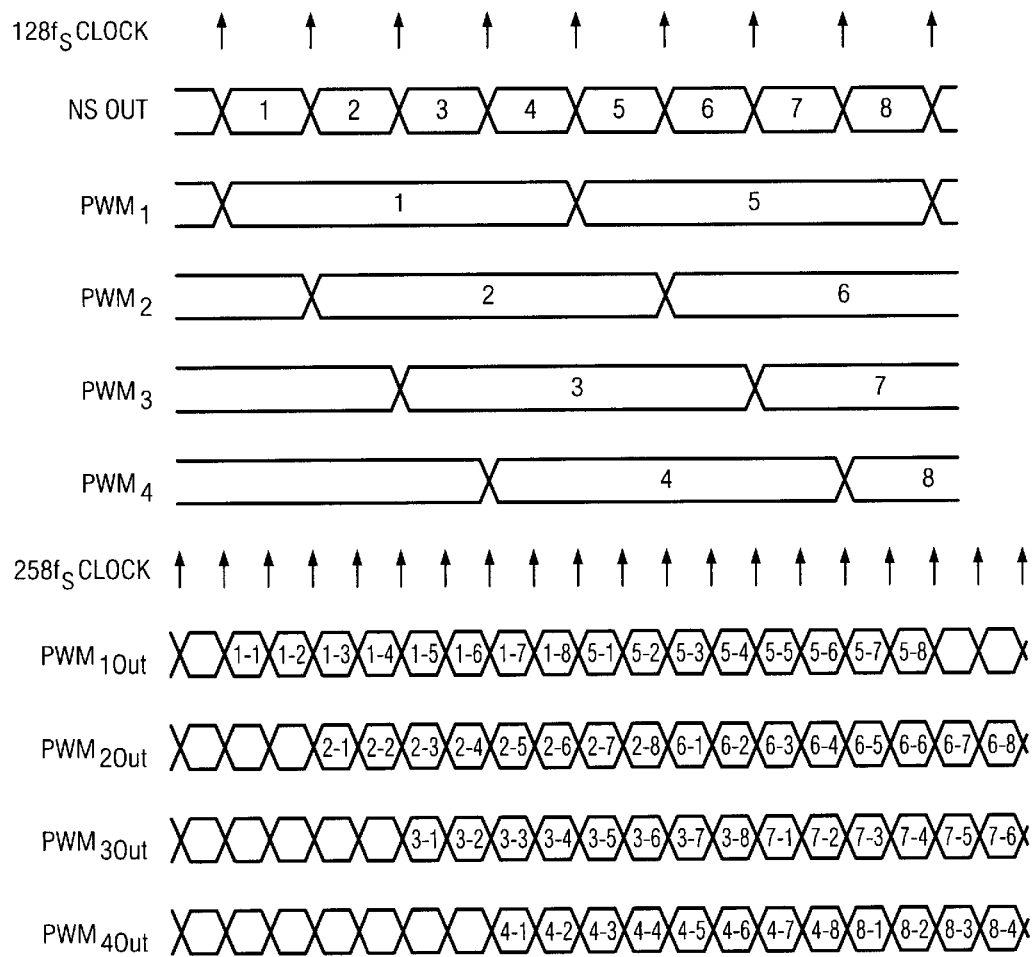
FIG. 3 is a timing diagram illustrating the signal timing of representative operations of the delta-sigma modulator and pulse width modulators shown in FIG. 1 for the exemplary by-four interleaved pulse width modulator.
Figure 4:
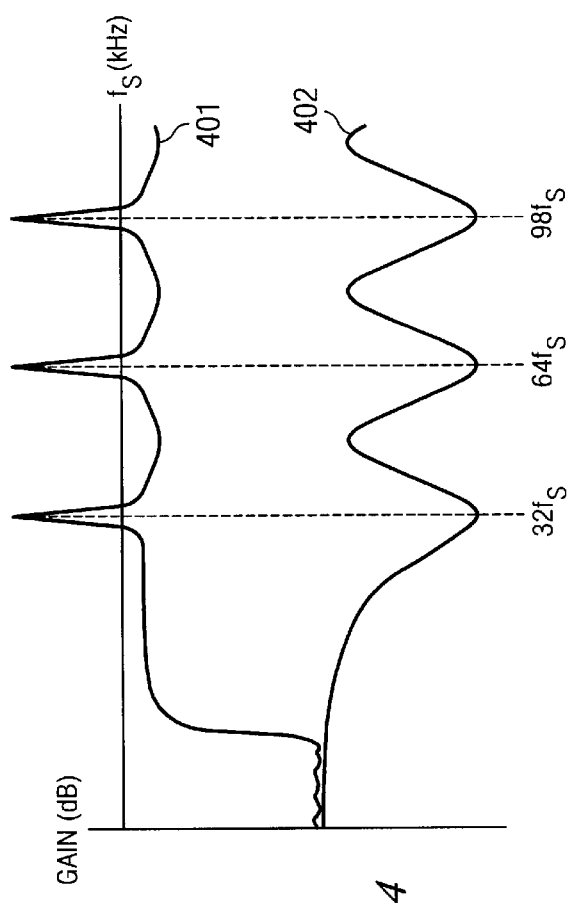
FIG. 4 is a gain versus frequency plot of the output of a selected one of the pulse width modulators of FIG. 1 for the exemplary by-four interleaved PWM and the response of the associated finite impulse response output filter.

FIG. 3 is a timing diagram depicting the conversion of an arbitrarily selected number of one-bit quantized samples output from noise shaper 102 at the 128fs oversampling frequency into multiple PWM streams at the 256 fs oversampling frequency. In FIG. 3, eight representative bits or samples (1–8) from the output of noise shaper 102 are shown by the trace labeled NSOUT. After a by-four interleave each PWM stage 104a to 104N operates on a new operand (sample) at the 32fs rate as respectively shown by the overlapping streams labeled $PWM_1$, $PWM_2$, $PWM_3$, and $PWM_4$.

For an eight-times oversampling, each PWM stage 104a to 104N encodes each corresponding sample received at the 32fs oversampling frequency into PWM encoded pulses, which are eight (8) periods of the 256fs oversampling clock signal, as represented by the streams labeled $PWM_{1OUT}$, $PWM_{2OUT}$, $PWM_{3OUT}$, and $PWM_{4OUT}$ in FIG. 3. For example, the $PWM_{1OUT}$ stream represents the output samples 1 and 5 of the noise shaper 102, after by-four interleaving by interleaving circuitry 103 and eight-times oversampling by the corresponding PWM stages 104a to 104N, as PWM modulation periods (pulses) 1-1 through 1-8 and 5-1 to 5-8.

The PWM encoded bitstreams $PWM_{1OUT}$, $PWM_{2OUT}$, $PWM_{3OUT}$, and $PWM_{4OUT}$ are offset in time by two periods of the 256fs PWM oversampling clock (or equivalently one period of the 128fs noise shaper oversampling clock). Each of these time-overlapped streams modulates energy in the signal baseband of approximately 0 to fs/2 along with significant energy at the harmonics of the repeat frequency 32fs (e.g. 32fs, 64fs, 96fs, and so on) as shown in trace 401 of the output gain versus frequency plot of FIG. 4. Consequently, each of the four PWM stages 104a to 104N is associated with an output FIR filter 105a to 105N with a response generally shown by trace 402 in FIG 4. In particular, the response of each FIR filter 105a to 105N has notches about the harmonics of 32fs corresponding to the peaks in the output response of the corresponding PWM stage 104a to 104N at the same frequencies. FIR response 402 is achieved, for example, by using 16 stage boxcar FIR filters with simple coefficients.

In an embodiment with four digital-in, analog-out FIR filters 105a to 105N, each having a 16 stage boxcar filter, sixty-four analog outputs are provided into output summer 106. The sixty-four analog outputs overlap in time and are matched in usage and transition rate (transition density). The result is a continuous-time, analog output with minimal noise and distortion due to ISI. Advantageously, the structure is such that all DAC elements have the same edge rate and same duty cycle of use. To a significant degree, this advantage causes the cancellation of all distortion and noise products.

Figure 5:
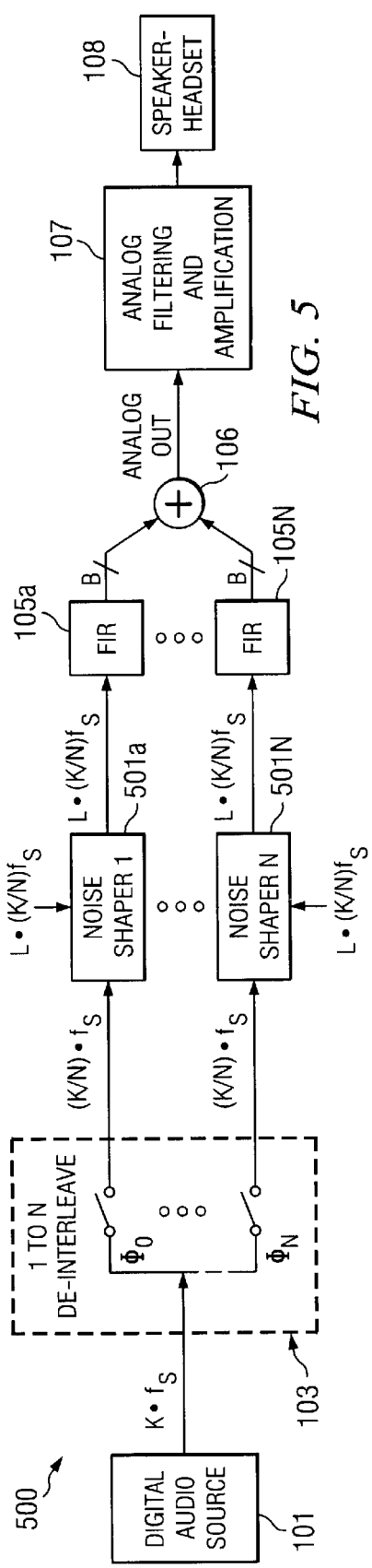
FIG. 5 is a high level operational block diagram of an exemplary digital to analog converter utilizing interleaved noise shapers and corresponding digital output filters according to the inventive principles.

The principles of the present invention are also embodied in the exemplary delta-sigma data converter 500 shown in FIG. 5 in which N number of delta-sigma modulators (noise shapers) 501a–501N are interleaved in time and the resulting de-interleaved output streams are directly passed to output digital-in analog-out FIR filters 105a to 105N. In FIG. 5, L is the oversampling factor for each noise shaping stage 501a–501N. The quantized data streams from noise shaping stages 501a–501N are converted in FIR filters 105a, . . . ,N at a frequency greater than or equal to the oversampling frequency L·(K/N)fs of noise shapers 501a–501N. Advantageously, the DAC elements of FIR filters 105a, . . . ,N are therefore matched in duty-cycle (usage) and transition rate as previously described.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A digital to analog converter, comprising:
    a noise shaping modulator for modulating an input digital data stream;
    a plurality of output elements for generating a plurality of intermediate data streams from a modulated output stream from the modulator;
    an output summer for summing the intermediate data streams to generate an output analog stream; and
    wherein the noise shaping modulator balances an edge transition rate of the output elements such that the edge transition rate of two selected elements is approximately equal.

2. The data converter of claim 1, wherein the plurality of output elements comprises at least eight output elements.

3. The digital-to-analog converter of claim 1, wherein the modulator balances a duty cycle of the output elements, such that the usage of two selected elements is approximately equal.

4. A data converter, comprising:
    a duty cycle modulator for converting a received data stream having a frequency into a duty cycle modulated data stream; and
    a finite impulse response filter for filtering harmonics of the frequency of the received data stream from the duty cycle modulated data stream.

5. The data converter of claim 4, wherein the finite impulse response filter has a null at a repeat rate of the duty cycle modulated data stream.

6. The data converter of claim 4, further comprising a plurality of digital to analog conversion elements coupled to corresponding taps of the finite impulse response filter.

7. The data converter of claim 6, wherein the plurality of digital to analog conversion elements comprise continuous time conversion elements.

8. The data converter of claim 7, wherein the conversion elements comprise controlled current sources.

9. The data converter of claim 7, wherein the conversion elements comprise resistors.

10. The data converter of claim 4, further comprising:
    a second duty cycle modulator for converting a second data stream having a frequency into a second duty cycle modulated data stream; and
    a second finite impulse response filter for filtering harmonics of the frequency of the second data stream from the second duty cycle modulated data stream.

11. The data converter of claim 10, further comprising combining circuitry for combining outputs of the first and second filters.

12. The data converter of claim 10, further comprising de-interleaving circuitry for de-interleaving an input data stream into the received data stream and the second data stream.

13. The data converter of claim 12, further comprising a delta-sigma modulator for noise shaping the input data stream, wherein the delta-sigma modulator has a noise transfer function with multiple attenuation bands for reducing noise exposure to mismatch between the duty cycle modulator and the second duty cycle modulator.

14. The data converter of claim 4, wherein the received data stream is generated by a delta-sigma modulator having at least one integrator and non-linear feedback to the at least one integrator.

15. The data converter of claim 14, wherein the non-linear feedback corrects for variations in a selected moment of the duty cycle modulated data stream.

16. The data converter of claim 15, wherein the non-linear feedback is provided by a selected one of non-linear feedback operations.

17. A digital to analog converter, comprising:
    a noise shaper for generating a noise-shaped data stream at a first frequency;
    at least one pulse width modulator stage for generating from the noise-shaped data stream a pulse width encoded data stream at a second frequency of a selected multiple of the first frequency;
    output circuitry for converting the pulse width encoded data stream into an analog signal comprising:
        a finite impulse response filter for filtering the pulse width encoded data stream at a frequency greater than or equal to the second frequency; and
        a plurality of digital to analog conversion elements coupled to selected taps of the finite impulse response filter for generating an output analog signal.

18. The digital to analog converter of claim 17, wherein the noise shaper comprises a delta-sigma modulator having a plurality of integration stages and correction circuitry for selectively feeding back correction factors to selected ones of the integration stages for correcting for variations in a moment of the pulse width encoded stream.

19. The digital to analog converter of claim 17, wherein the at least one pulse width modulation stage comprises a plurality of parallel pulse width modulation stages, wherein the digital to analog converter further de-interleaves the noise shaped data stream into a plurality of data streams corresponding to the plurality of pulse width modulation stages and each of the plurality of data streams has a frequency proportional to the frequency of the noise shaped data stream and a number of the plurality of pulse width modulation stages.

20. The digital to analog converter of claim 19, wherein the noise shaper comprises a delta-sigma modulator with multiple noise attenuation bands in an output noise transfer function for reducing noise exposure to mismatch between the plurality of pulse width modulation stages.

21. The digital to analog converter of claim 17, wherein the plurality of digital to analog conversion elements comprises a plurality of continuous-time digital to analog conversion elements.

22. A delta-sigma data converter, comprising:
    a delta-sigma modulator for quantizing received data into first and second quantized samples; and
    first and second interleaved output elements respectively operating on the first and second quantized samples to generate first and second output streams with balanced transition densities.

23. The delta-sigma modulator of claim 22, wherein the delta-sigma modulator has a multiple attenuation band transfer function selected to balance mismatch between the first and second interleaved continuous time output elements.

24. The delta-sigma data converter of claim 22, further comprising first and second interleaved pulse width modulators for converting the first and second quantized samples into first and second pulse width modulated signals for respectively driving the first and second interleaved output elements.

25. The delta-sigma data converter of claim 22, further comprising a digital filter system having taps driving the first and second output elements.

26. The delta-sigma data converter of claim 22, wherein the first and second output elements comprise continuous-time one-bit digital to analog conversion elements having outputs summing to generate the output signal.

27. A method of data conversion, comprising:

converting a data stream having a frequency into a duty cycle modulated data stream; and filtering harmonics of the frequency of data stream from the duty cycle modulated data stream with a finite impulse response filter.

28. The method of claim 27, further comprising noise shaping the data stream at the frequency prior to conversion into the duty cycle modulated data stream at a higher slot frequency.

29. The method of claim 28, wherein filtering harmonics further comprises filtering the stream of duty cycle modulated data patterns at a frequency equal or greater to the slot frequency.

30. A data converter, comprising:

first and second noise shapers interleaved in time to noise shape corresponding portions of a stream of input data; and first and second finite impulse response filters respectively filtering output data streams from the first and second noise shapers.

31. The data converter of claim 30, further comprising first and second sets of digital to analog conversion elements coupled to corresponding taps of the first and second finite impulse response filters.

32. The data converter of claim 30, wherein the first and second finite impulse response filters further comprise digital-in, analog-out finite impulse response filters.

33. The data converter of claim 30, wherein the digital to analog conversion elements further comprise continuous-time conversion elements.

34. A data converter comprising a signal input, a first and second duty cycle modulated signals responsive to the input signal, a first controllable current source responsive to the first duty cycle signal, a second controllable current source responsive to the second duty cycle signal, and a summer responsive to both controlled current sources.

* * * * *